United States Patent  
Uchida et al.

(10) Patent No.: US 7,839,913 B2  
(45) Date of Patent: Nov. 23, 2010

(54) SURFACE EMITTING LASER, SURFACE EMITTING LASER ARRAY, AND IMAGE FORMING APPARATUS INCLUDING SURFACE EMITTING LASER

(75) Inventors: Takeshi Uchida, Tokyo (JP); Tetsuya Takeuchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 115 days.

(21) Appl. No.: 12/272,033

(22) Filed: Nov. 17, 2008

(65) Prior Publication Data  
US 2009/0135872 A1     May 28, 2009

(30) Foreign Application Priority Data  
Nov. 22, 2007  (JP) .............................. 2007-302979  
Oct. 7, 2008   (JP) .............................. 2008-260710

(51) Int. Cl.  
*H01S 5/00*   (2006.01)  
(52) U.S. Cl. ................. 372/50.124; 372/43.01  
(58) Field of Classification Search ............. 372/43.01, 372/50.124  
See application file for complete search history.

(56) References Cited

U.S. PATENT DOCUMENTS

| | | | |
|---|---|---|---|
| 4,949,350 A * | 8/1990 | Jewell et al. ............. | 372/45.01 |
| 5,104,824 A | 4/1992 | Clausen, Jr. et al. ........... | 437/90 |
| 5,966,159 A * | 10/1999 | Ogasawara ................. | 347/133 |
| 6,748,003 B1 | 6/2004 | Knopp et al. ................. | 372/46 |
| 2004/0062283 A1 | 4/2004 | Takeuchi et al. ............. | 372/45 |
| 2005/0271113 A1 | 12/2005 | Song et al. .................... | 372/98 |
| 2007/0201527 A1 | 8/2007 | Hori et al. .............. | 372/50.124 |
| 2007/0223546 A1* | 9/2007 | Brenner et al. .......... | 372/43.01 |
| 2008/0056320 A1 | 3/2008 | Takeuchi ................. | 372/45.01 |
| 2008/0304532 A1 | 12/2008 | Uchida .................. | 372/50.124 |

FOREIGN PATENT DOCUMENTS

| | | |
|---|---|---|
| EP | 1 801 940 A1 | 6/2007 |
| JP | 2002-359434 A | 12/2002 |
| JP | 2006-253484 A | 9/2006 |
| WO | WO 2006/056208 A2 | 6/2006 |

OTHER PUBLICATIONS

Unold, H.J., et al., "Improving Single-Mode VCSEL Performance by Introducing a Long Monolithic Cavity", IEEE Photonics Technology Letters, vol. 12, No. 8, Aug. 2000, pp. 939-941.  
Y. Kohama et al., "0.85 μm bottom-emitting vertical-cavity surface-emitting laser diode arrays grown on AlGaAs substrates," Electronic letters, vol. 30, No. 17, pp. 1406-1407, Aug. 18, 1994.

* cited by examiner

*Primary Examiner*—Armando Rodriguez  
(74) *Attorney, Agent, or Firm*—Fitzpatrick, Cella, Harper & Scinto

(57) ABSTRACT

A surface emitting laser that oscillates at a wavelength λ includes an upper reflector, a lower reflector, an active layer, and a spacer layer. The spacer layer is a laminated structure that includes a first semiconductor sublayer having a composition of $Al_xGa_{1-x}As$ ($1 \geq x > 0$) and a second semiconductor sublayer having a composition of $Al_yGa_{1-y}As$ ($1 > y > 0$ and $x > y$).

20 Claims, 9 Drawing Sheets

SURFACE EMITTING LASER, SURFACE EMITTING LASER ARRAY, AND IMAGE FORMING APPARATUS INCLUDING SURFACE EMITTING LASER

BACKGROUND OF THE INVENTION

1. Field of the Invention

The present invention relates to a surface emitting laser, a surface emitting laser array, and an image forming apparatus including a surface emitting laser.

2. Description of the Related Art

A VCSEL can emit a beam in a direction perpendicular to its semiconductor substrate and therefore can easily be applied to a two-dimensional array. Parallel processing of multiple beams emitted by a two-dimensional VCSEL array allows for a higher density and a higher speed. Thus, a VCSEL is expected to be used for various industrial applications.

In a VCSEL, to efficiently supply an electric current to an active layer, $Al_xGa_{1-x}As$ (hereinafter also referred to as "AlGaAs") having a high Al content is selectively oxidized to form a current confinement structure. A typical diameter of current confinement is generally about 3 µm for single transverse mode operation.

However, such a small confinement diameter results in a small active area and therefore greatly reduces the output of a laser device.

To perform single transverse mode oscillation even at a larger confinement diameter, IEEE Photonics Technology Letters, vol. 12, No. 8, 2000, p. 939, proposes to increase the diffraction loss of a higher-order transverse mode by increasing the cavity length. The structure of a surface emitting laser device described in this IEEE document will be described below with reference to FIG. 2.

A lower semiconductor multilayer reflector 220 is disposed on a GaAs substrate 210. The lower semiconductor multilayer reflector 220 includes alternately stacked low and high refractive index sublayers. Each of the low refractive index sublayers and the high refractive index sublayers has an optical thickness of λ/4. The optical thickness of a layer is the product of the thickness of the layer and the refractive index of the material forming the layer. The wavelength λ refers to the oscillation wavelength. A multilayer reflector is also referred to as a distributed Bragg reflector (DBR).

A GaAs spacer layer 230 having a thickness larger than usual is disposed on the lower semiconductor multilayer reflector 220. A lower cladding layer 240, an active layer 250 including quantum wells, and an upper cladding layer 260 are disposed in this order on the spacer layer 230. An upper semiconductor multilayer reflector 270 is disposed on the upper cladding layer 260. The upper semiconductor multilayer reflector 270 includes alternately stacked low and high refractive index sublayers.

The spacer layer 230 is formed only of GaAs and has a length in the range of 2 to 8 µm. Generally, in surface emitting lasers, the optical thickness of a cavity defined by upper and lower DBRs is designed to be about one or two wavelengths. For example, in a 980 nm laser described in the above-mentioned IEEE document, the cavity length is about 0.3 µm for a one-wavelength cavity and about 0.6 µm for a two-wavelength cavity.

In a surface emitting laser that includes a cavity having an optical thickness of one or two wavelengths, the laser oscillates in a higher-order mode, as well as a fundamental mode, at a diameter of oxidation confinement larger than 3 or 4 µm.

Because the surface emitting laser described in the above-mentioned IEEE document includes a spacer having a length as large as about 8 lam, oscillation in a single fundamental transverse mode is achieved even at a diameter of oxidation confinement of 7 µm. In a surface emitting laser having a long cavity structure, the long distance between DBRs serving as mirrors causes a propagating beam to spread. As for a beam within a surface emitting laser device, the divergence angle for a beam of a higher-order mode is larger than that for a fundamental mode. Thus, in a surface emitting laser having a long cavity structure, a beam of a higher-order mode tends to have a large diffraction loss while propagating between the DBRs. Single transverse mode oscillation in a fundamental mode is therefore more easily performed in the surface emitting laser having a long cavity structure than in lasers not having a long cavity structure.

In a surface emitting laser device, heat generation in the device has a large influence on its optical output power. Hence, improvement in heat dissipation capacity is another technical issue. In particular, the temperature characteristics of an active layer formed of AlGaInP/GaInP, in a surface emitting laser for a red band emission ranging from 630 to 690 nm are inferior to the temperature characteristics of an active layer in an infrared semiconductor laser. Thus, the heat dissipation capacity is more important in the surface emitting laser with an AlGaInP/GaInP active layer.

U.S. Patent Application Publication No. 2005/0271113 discloses a structure in which a heat conductive layer having an optical thickness of an integral multiple of λ/2 is disposed under a cladding layer. The heat conductive layer improves the heat dissipation capacity, thus increasing the laser output. The heat conductive layer is formed of GaAs, AlAs, or InP.

As described above, the practical utilization of a surface emitting laser for a red band emission requires single transverse mode oscillation and improved heat dissipation capacity. The present inventors used a thick AlAs film, which exhibits low band-to-band absorption, as a spacer layer to achieve single transverse mode oscillation and improved heat dissipation capacity.

However, as a result of extensive research, the present inventors found that an AlAs film having a thickness necessary for transverse mode control, for example, 1 µm or more, was difficult to grow. More specifically, the crystal growth of an AlAs monolayer film having a thickness of at least 1 µm resulted in such a rough crystal surface that the AlAs monolayer film was not acceptable as a substrate for use in a laser, especially for the growth of active layer.

In conclusion, while a laser device that includes an AlAs layer having a thickness below 1 µm may be produced to improve the heat dissipation capacity, an AlAs layer having a thickness necessary for single transverse mode oscillation of a long cavity, that is, at least 1 µm, is difficult to produce.

SUMMARY OF THE INVENTION

The present invention, in an aspect thereof, provides a surface emitting laser that has sufficient heat dissipation capacity, produces a higher laser output than conventional surface emitting lasers, and oscillates in a single transverse mode, regardless of a long cavity structure of the surface emitting laser. The present invention, in an aspect thereof, also provides a surface emitting laser array including the surface emitting laser and an image forming apparatus including the surface emitting laser or the surface emitting laser array.

The aforementioned problem that a thick AlAs monolayer is difficult to grow is merely an example. Aspects of the present invention provide a long cavity structure using a heat conductive material that is difficult to form as a thick film.

Accordingly, aspects of the present invention provide a surface emitting laser that has sufficient heat dissipation capacity, produces a higher laser output than conventional surface emitting lasers, and oscillates in a single transverse mode, regardless of a long cavity structure of the surface emitting laser. Aspects of the present invention also provide a surface emitting laser array including the surface emitting laser and an image forming apparatus including the surface emitting laser or the surface emitting laser array.

Further features of the present invention will become apparent from the following description of exemplary embodiments with reference to the attached drawings.

DESCRIPTION OF THE EMBODIMENTS

Figure 1:
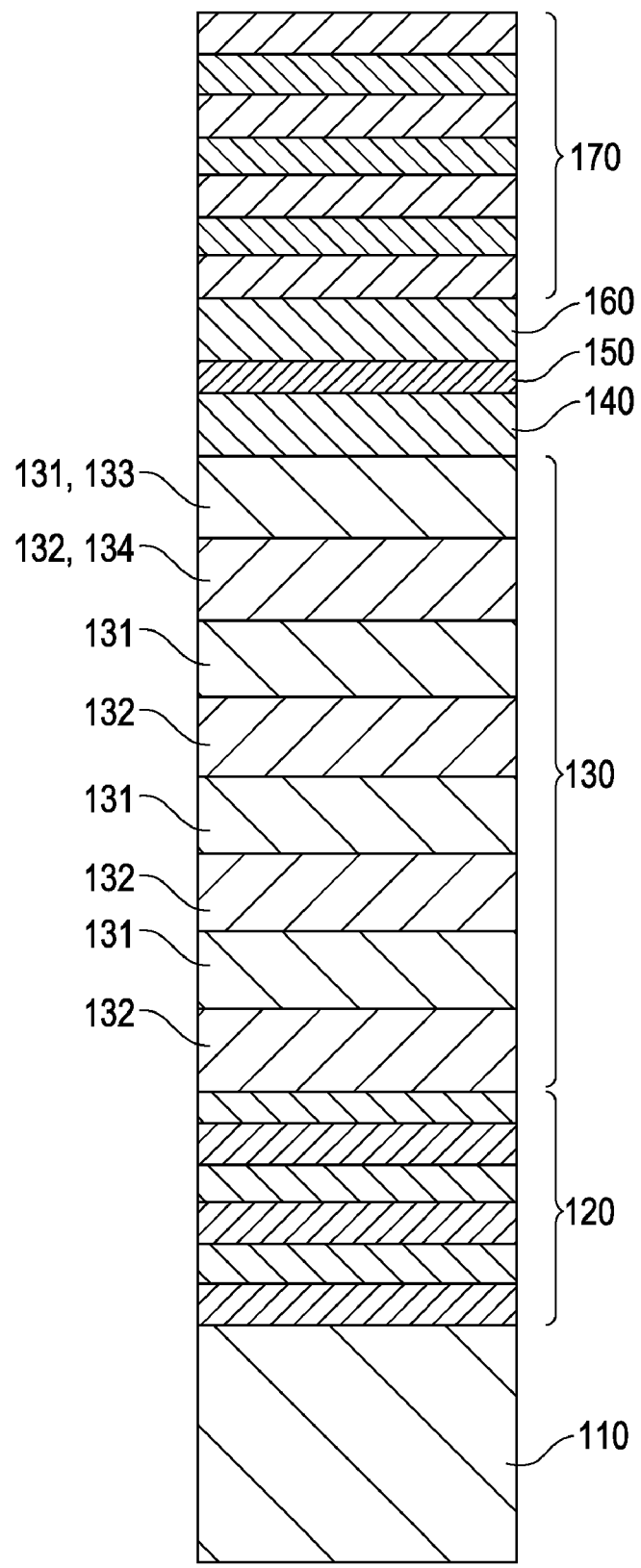
FIG. 1 is a schematic cross-sectional view of a laser device according to an embodiment of the present invention.
Figure 2:
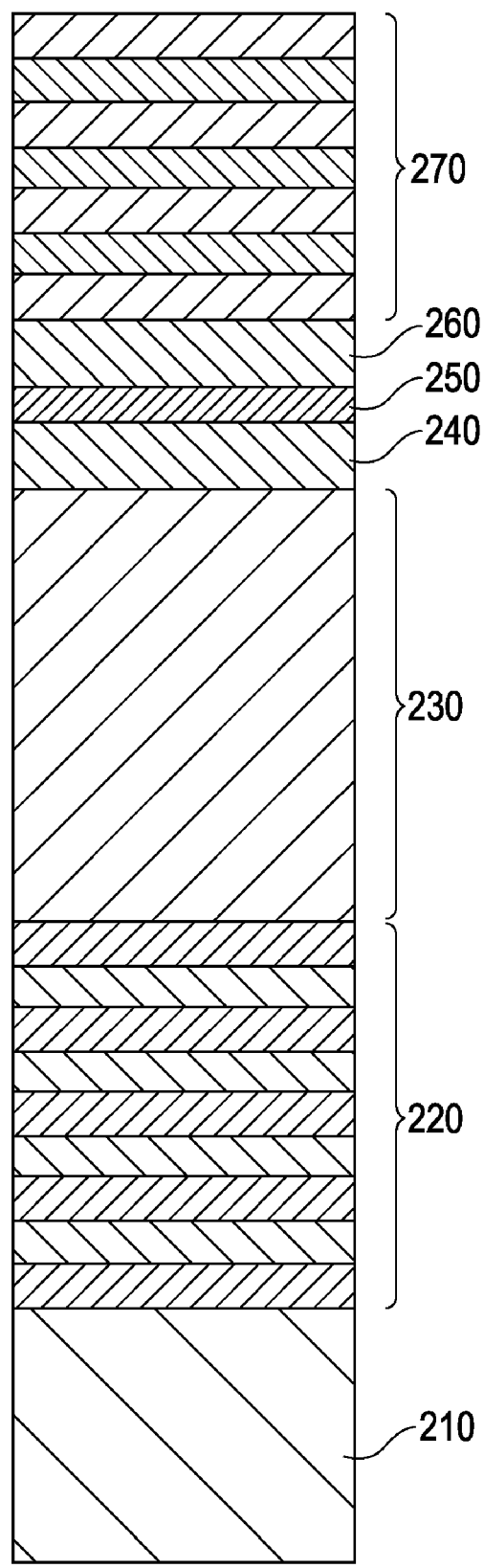
FIG. 2 is a schematic cross-sectional view of a laser device according to a conventional example.

FIG. 1 is a schematic cross-sectional view of a laser device according to an embodiment of the present invention.

A lower multilayer reflector 120 disposed on a substrate 110 includes alternately stacked low and high refractive index sublayers. A spacer layer 130, a lower cladding layer 140, an active layer 150, and an upper cladding layer 160 are disposed in this order on the lower reflector 120. An upper multilayer reflector 170 is disposed on the upper cladding layer 160.

The spacer layer 130 includes alternately stacked heat conductive first semiconductor sublayers 131 and second semiconductor sublayers 132. The second semiconductor sublayers 132 have a lower thermal conductivity than the first semiconductor sublayers 131.

The first semiconductor sublayers 131 are formed of a material having a higher thermal conductivity than the second semiconductor sublayers 132, such as aluminum arsenide (AlAs) or aluminum gallium arsenide (AlGaAs). The first semiconductor sublayers 131 can be formed of AlGaAs ($Al_xGa_{1-x}As$), wherein the Al/(Al+Ga) atomic ratio can be at least 0.90 ($x \geq 0.90$) or at least 0.95 ($x \geq 0.95$). The first semiconductor sublayers 131 can be formed of AlAs ($x=1$).

The second semiconductor sublayers 132 can be AlGaAs sublayers, which have a lower thermal conductivity than the first semiconductor sublayers 131. The second semiconductor sublayers 132, together with the first semiconductor sublayers 131, constitute a long cavity structure. More specifically, the second semiconductor sublayers 132 can be formed of $Al_yGa_{1-y}As$, wherein the Al/(Al+Ga) atomic ratio is smaller than the Al/(Al+Ga) atomic ratio in the first semiconductor sublayers 131 ($1>y>0$ and $x>y$).

The optical thickness of each of the first semiconductor sublayers 131 and the second semiconductor sublayers 132 is set to be an integral multiple of $\lambda/2$. In this case, light beams reflected by interfaces between the first semiconductor sublayers 131 and the second semiconductor sublayers 132 cancel each other out. Thus, unlike the multilayer reflectors 120 and 170, the spacer layer 130 does not significantly reflect light. The phrase "an integral multiple of $\lambda/2$", as used herein, refers to an optical thickness at which light within a laser device is not significantly reflected. Thus, the phrase "an integral multiple of $\lambda/2$" includes an optical thickness slightly different from the integral multiple of $\lambda/2$, provided that light within a laser device is not significantly reflected at the optical thickness.

The first semiconductor sublayers 131 therefore have suppressed optical action, such as reflection, while having high thermal conductivity.

Even when the first semiconductor sublayers 131 are formed of a material that is difficult to form as a thick film, the second semiconductor sublayers 132 having an optically inert thickness are alternately stacked in the spacer layer 130 to form a long cavity structure. The long cavity structure provides a long optical path in the laser device. A beam of a higher-order mode, which spreads more widely than a beam in a fundamental mode, therefore has a large diffraction loss. This facilitates single transverse mode oscillation in a fundamental mode.

The present invention, according to aspects thereof, is effective when a long cavity structure cannot be formed only of a heat conductive material.

The characteristics of a surface emitting laser are also affected by its heat dissipation capacity in the horizontal direction. The spacer layer 130 composed of alternating sublayers can also improve the heat dissipation capacity in the horizontal direction.

The first semiconductor sublayers 131 can be adjacent to or near the heat generating active layer 150 to ensure heat dissipation. For example, as illustrated in FIG. 1, an uppermost first semiconductor sublayer 133 of the spacer layer 130 can be closer to the active layer 150 than an uppermost second semiconductor sublayer 134.

The uppermost first semiconductor sublayer 133 can have a larger thickness than that of the other first semiconductor sublayers 131. For example, the uppermost first semiconductor sublayer 133 can have an optical thickness of $5\lambda$, and the other first semiconductor sublayers 131 can have an optical thickness of $\lambda/2$.

The Al/(Al+Ga) atomic ratio (corresponding to y) of the $Al_yGa_{1-y}As$ semiconductor sublayers 132 can be determined in consideration of the optical absorption and the flatness achievable from crystal growth.

In semiconductors, light having a particular wavelength or less undergoes high optical absorption due to band-to-band absorption. The particular wavelength depends on the band gap of a semiconductor. The band gap increases with the Al/(Al+Ga) atomic ratio. A surface emitting laser requires a material that has a reduced optical absorption at the oscillation wavelength. Thus, the Al/(Al+Ga) atomic ratio of the $Al_yGa_{1-y}As$ semiconductor sublayers 132 could be increased to avoid the band-to-band absorption at the oscillation wavelength.

For example, the Al/(Al+Ga) atomic ratio can be at least 0.16 ($Al_yGa_{1-y}As$ ($1>y\geq0.16$)) for an 850 nm band and at least 0.50 ($Al_yGa_{1-y}As$ ($1>y\geq0.50$)) for a 680 nm band, in view of optical absorption.

However, an excessively high Al/(Al+Ga) atomic ratio has an adverse effect on the flatness of a crystal growth face. Thus, the Al/(Al+Ga) atomic ratio is desirably low in this regard. In particular, the second semiconductor sublayers 132 reduce surface roughness caused by the growth of the first semiconductor sublayers 131. Thus, the Al/(Al+Ga) atomic ratio is desirably low in this regard.

As described above, there is a trade-off between the reduction in optical absorption and the flatness of a crystal growth face. Thus, the Al/(Al+Ga) atomic ratio of AlGaAs is reduced to such a level that optical absorption is negligible.

For example, the Al/(Al+Ga) atomic ratio of AlGaAs can range from 0.16 to 0.26 ($Al_yGa_{1-y}As$ ($0.26\geq y\geq0.16$)) for the 850 nm band and 0.50 to 0.60 ($Al_yGa_{1-y}As$ ($0.60\geq y\geq0.50$)) for the 680 nm band.

Because GaAs can be used for a spacer layer at a wavelength range of a 980 nm laser that includes an InGaAs active layer and a longer wavelength range, a long cavity structure can be formed of a GaAs monolayer. However, AlAs has higher thermal conductivity than GaAs. Thus, the present invention can be used suitably. More specifically, the first semiconductor sublayers 131 formed of $Al_xGa_{1-x}As$ ($1\geq x>0$) and the second semiconductor sublayers 132 formed of $Al_yGa_{1-y}As$ ($1>y>0$ and $x>y$) can also be used for the 980 nm band.

In the wavelength range of an 850 nm laser that includes a GaAs active layer and the wavelength range of a 780 nm laser that includes an AlGaAs active layer, a GaAs spacer layer is difficult to use in terms of optical absorption, and an AlGaAs spacer layer is used necessarily. However, because AlGaAs has lower thermal conductivity than AlAs, a laser device including a thick AlGaAs monolayer has low heat dissipation capacity. Thus, aspects of the present invention can suitably be used for an 850 nm laser and a 780 nm laser each having a long cavity structure. More specifically, the first semiconductor sublayers 131 formed of $Al_xGa_{1-x}As$ ($1\geq x>0$) and the second semiconductor sublayers 132 formed of $Al_yGa_{1-y}As$ ($1>y>0$ and $x>y$) can also be used for the 850 nm band laser and a 780 nm band laser.

In a wavelength range of a red band (630 to 690 nm) laser that includes a GaInP active layer, GaAs or InP is difficult to use in terms of lattice matching or optical absorption. In this wavelength range, AlGaAs containing about 20% Al, which can be formed as a slightly thick film and does not have significantly low thermal conductivity, is also difficult to use. As in the surface emitting laser device described in IEEE Photonics Technology Letters, Vol. 12, No. 8, 2000, p. 939, when a long cavity structure is formed of a thick monolayer film, AlGaAs containing about 50% Al is used necessarily in consideration of optical absorption and the flatness achievable from crystal growth. However, because AlGaAs has the lowest thermal conductivity at an Al content of about 50%, a laser device having a long cavity structure formed of a thick AlGaAs monolayer has a reduced heat dissipation capacity. Thus, for this 680 nm band laser, aspects of the present invention can be used more suitably than for the aforementioned wavelength bands.

The present inventors found that $Al_xGa_{1-x}As$ ($1>x\geq0.90$) and AlAs are difficult to be formed as a film having a thickness of 1 μm or more while maintaining high crystal quality and flatness by currently known film-forming techniques. Thus, when the first semiconductor sublayers 131 are formed of $Al_xGa_{1-x}As$ ($1>x\geq0.90$) or AlAs, each sublayer 131 should have a thickness of 1 μm or less.

The present inventors also found that, depending on the confinement diameter, the cavity length can be at least 2 μm to provide a long cavity structure that contributes to single transverse mode oscillation. Thus, the thickness of the spacer layer 130 can be determined in consideration of the cavity length. The term "cavity length", as used herein, refers to a physical distance between the top surface of an upper reflector and the bottom surface of a lower reflector.

In FIG. 1, although the spacer layer 130 is shown to be disposed between the active layer 150 and the lower reflector 120, alternatively the spacer layer 130 may be disposed between the active layer 150 and the upper reflector 170. Also alternatively, spacer layers 130 may be disposed between the active layer 150 and the lower reflector 120 and between the active layer 150 and the upper reflector 170.

When the reflectors are p-type and n-type DBRs, the p-type DBR exhibits higher optical absorption than the n-type DBR because of doping. The spacer layer 130 can therefore be disposed on the side of the n-type DBR having lower optical absorption. When the lower reflector 120 is an n-type DBR, the spacer layer 130 can be disposed between the active layer 150 and the lower reflector 120, as illustrated in FIG. 1.

Such surface emitting lasers may be one- or two-dimensionally arranged to form a surface emitting laser array.

Furthermore, an image forming apparatus may be fabricated using the surface emitting laser or the surface emitting laser array as a light source.

First Embodiment

Figure 3:
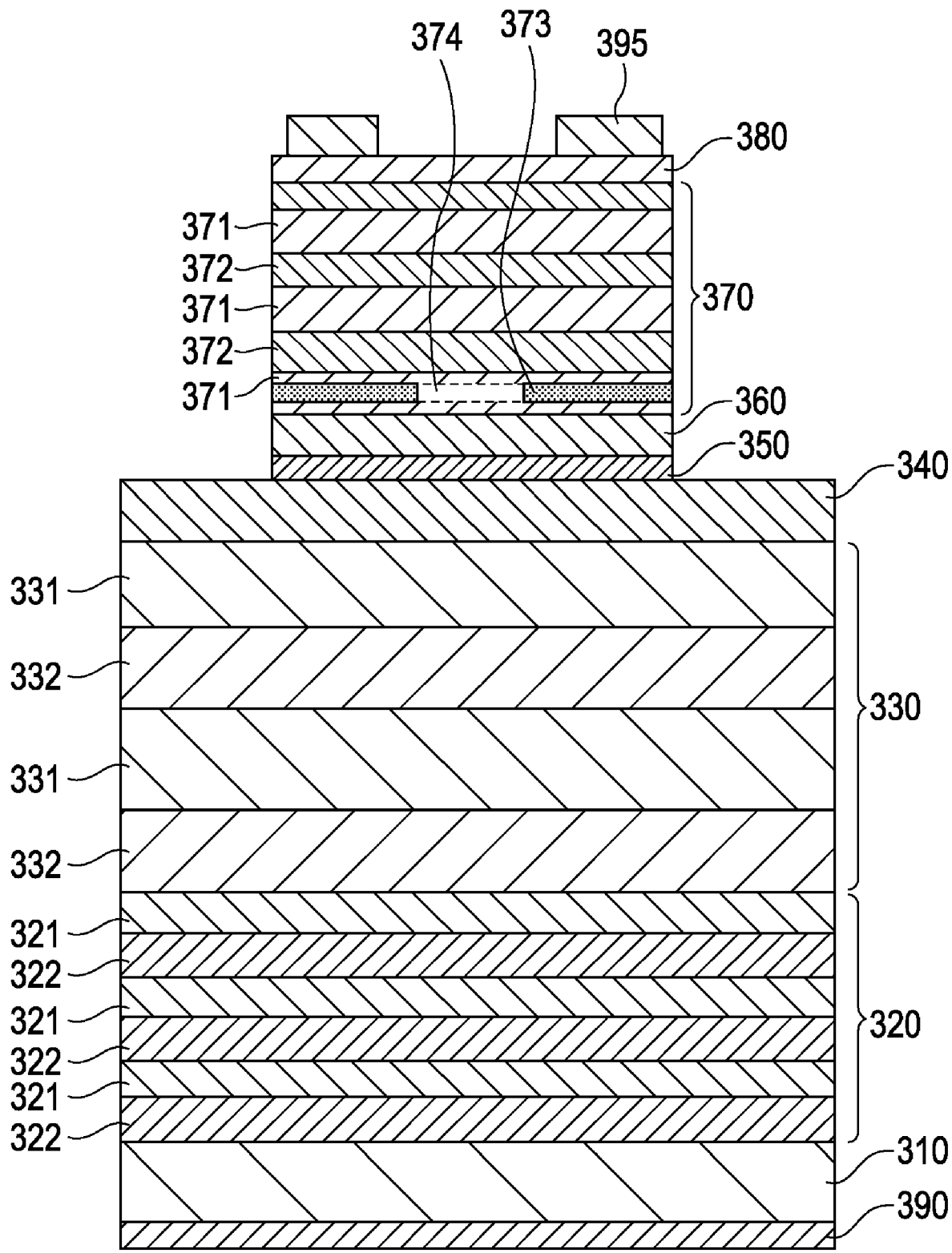
FIG. 3 is a schematic cross-sectional view of a surface emitting laser according to a first embodiment.

FIG. 3 is a schematic cross-sectional view of a red surface emitting laser according to a first embodiment.

A lower DBR 320 is disposed on an n-type GaAs substrate 310. The lower DBR 320 includes alternately stacked n-type AlAs sublayers 321 and n-type $Al_{0.5}Ga_{0.5}As$ sublayers 322. Each of the n-type AlAs sublayers 321 and the n-type $Al_{0.5}Ga_{0.5}As$ sublayers 322 has an optical thickness of $\lambda/4$. Although the lower DBR 320 is shown to include three pairs of the n-type AlAs sublayers 321 and the $Al_{0.5}Ga_{0.5}As$ sublayers 322 for convenience, the lower DBR 320 practically can include a desired number of pairs (for example, 60 pairs).

A spacer layer 330 is disposed on the lower DBR 320. The spacer layer 330 includes alternately stacked first AlAs semiconductor sublayers 331 and second $Al_{0.5}Ga_{0.5}As$ semiconductor sublayers 332. Each of the first semiconductor sublayers 331 and the second semiconductor sublayers 332 has an optical thickness of $\lambda/2$. As described above, the optical thickness is not necessarily an integral multiple of $\lambda/2$, provided that light within a laser device is not significantly reflected.

An AlGaInP layer 340, an active layer 350 containing four quantum wells ($Ga_{0.45}In_{0.55}P$), and an AlGaInP layer 360 are disposed on the spacer layer 330. The total optical thickness of the AlGaInP layer 340, the active layer 350, and the AlGaInP layer 360 is one wavelength.

A p-type upper DBR 370 is disposed on the AlGaInP layer 360. The upper DBR 370 includes alternately stacked $Al_{0.9}Ga_{0.1}As$ sublayers 371 and $Al_{0.5}Ga_{0.5}As$ sublayers 372. Each of the $Al_{0.9}Ga_{0.1}As$ sublayers 371 and the $Al_{0.5}Ga_{0.5}As$ sublayers 372 has an optical thickness of $\lambda/4$. While the upper DBR 370 is shown to include three pairs of the $Al_{0.9}Ga_{0.1}As$ sublayers 371 and the $Al_{0.5}Ga_{0.5}As$ sublayers 372 for convenience, the upper DBR 370 practically can include a desired number of pairs (for example, 36 pairs).

A lowermost $Al_{0.9}Ga_{0.1}As$ sublayer 371 includes an $Al_{0.98}Ga_{0.02}As$ layer (selective oxidation layer) having a thickness of 30 nm. An oxidized region 373 and an unoxidized region 374 are formed in the selective oxidation layer by steam oxidation after the formation of a post, thus forming a current confinement structure. The confinement structure (unoxidized region) 374 has a diameter of 5 µm.

A highly doped p-type GaAs layer 380 having a thickness of 10 nm and an upper electrode 395 are disposed on the upper DBR 370. The n-type GaAs substrate 310 is electrically connected to a lower electrode 390.

The spacer layer 330 has a thickness of 5 µm. The thickness of the spacer layer 330 depends on the desired emission diameter. For example, to achieve a single transverse mode at a diameter of oxidation confinement of 5 µm, the thickness of the spacer layer 330 should be at least 3 µm.

The spacer layer 330 includes the alternately stacked $Al_{0.5}Ga_{0.5}As$ sublayers 332 and AlAs sublayers 331. Each of the sublayers 331 and 332 has an optical thickness of $\lambda/2$.

The crystal growth of AlAs alone often forms a rough surface. Thus, after the crystal growth of AlAs is appropriately controlled, $Al_yGa_{1-y}As$ is grown to reduce the surface roughness caused by the crystal growth of AlAs. This is because Ga atoms can migrate more widely than Al atoms, thus providing a flatter surface. The present embodiment can therefore solve the problem of surface roughness due to a thick AlAs sublayer. Thus, the spacer layer 330 including heat conductive semiconductor sublayers 331 can have a length as large as several micrometers.

As described above, GaAs and InP can be used in a 980 nm, 1.3 µm, or 1.55 µm surface emitting lasers. GaAs and InP can easily grow to a thickness above 1 µm, although GaAs and InP have a lower thermal conductivity than AlAs. Thus, GaAs or InP can be used to form a long cavity structure relatively easily.

However, GaAs and InP are difficult to use in a red band laser. Furthermore, a long cavity structure formed of AlAs, which is a desirable material in terms of thermal conductivity and optical absorption, is difficult to form by currently known crystal growth techniques.

Thus, a surface emitting laser according to aspects of the present invention has considerable advantages in a red band.

Manufacturing Method

The following is a method for manufacturing a surface emitting laser according to the first embodiment.

In the laser device illustrated in FIG. 3, the n-type GaAs substrate 310, the lower DBR 320, the spacer layer 330, the AlGaInP layer 340, the active layer 350, the AlGaInP layer 360, the upper DBR 370, and the p-type GaAs layer 380 are grown by metal-organic chemical vapor deposition (MOCVD) or molecular-beam epitaxy (MBE).

Part of the layers from the active layer 350 to the p-type GaAs layer 380 are removed by dry etching using semiconductor lithography and a generally known semiconductor etching technique, thus forming a columnar post having a diameter of about 30 µm on the AlGaInP layer 340. Because the AlAs sublayers 331 are easily oxidized, dry etching is stopped on the AlGaInP layer 340.

The selective oxidation layer in the lowermost $Al_{0.9}Ga_{0.1}As$ sublayer 371 is then oxidized horizontally in a steam atmosphere at about 450° C. The oxidation time is controlled to form the oxidized region 373 and the unoxidized region (confinement structure) 374, which confines an electric current and a light beam. In consideration of modal control, the oxidation time is controlled such that the confinement structure 374 has a diameter of about 5 µm.

The p-side upper electrode 395 and the n-side lower electrode 390 are then deposited by vacuum evaporation and lithography. The upper electrode 395 has a circular window from which a light beam emerges.

Finally, the electrodes and the semiconductors are alloyed in a high-temperature nitrogen atmosphere to achieve excellent electrical characteristics, thus completing the laser device.

Figure 4:
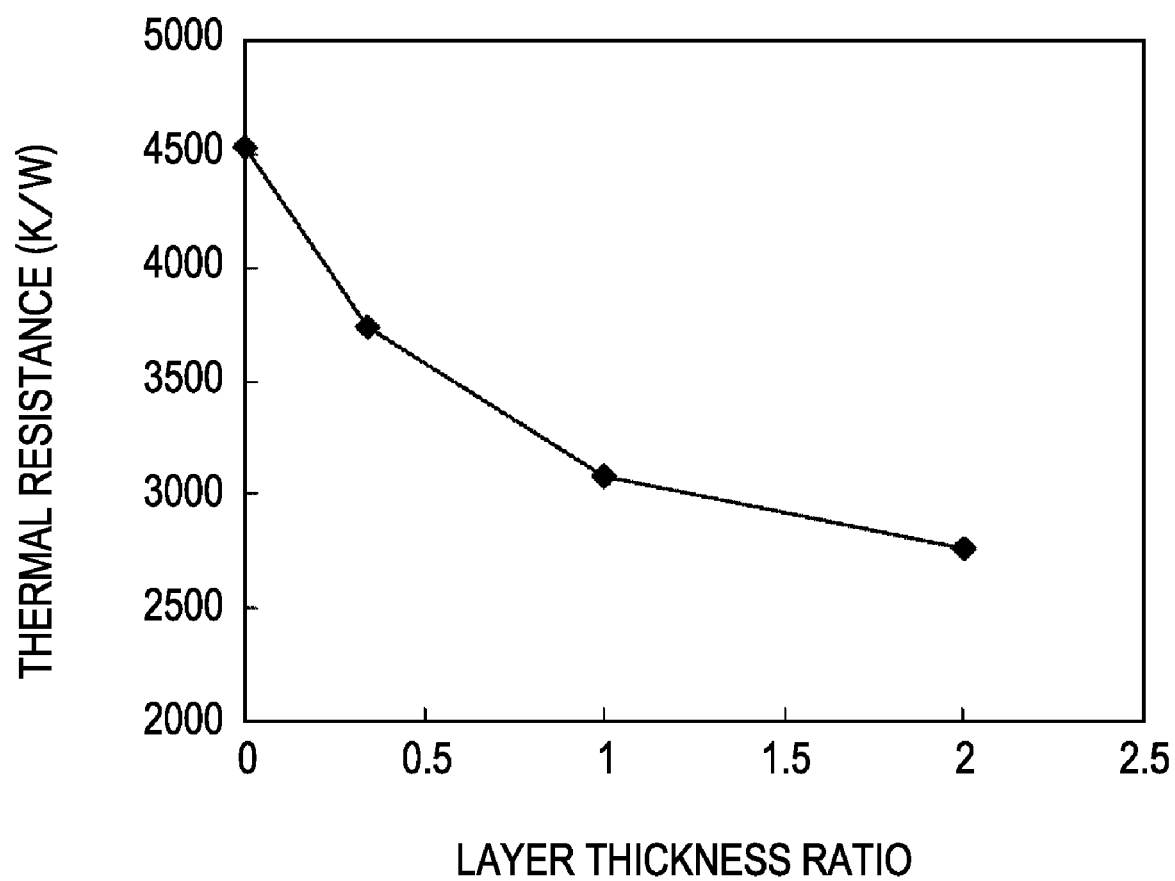
FIG. 4 is a graph illustrating thermal resistance as a function of the thickness ratio in a spacer layer.

FIG. 4 shows the relationship between thermal resistance and thickness ratio in a spacer layer.

The horizontal axis represents the thickness ratio of an AlAs sublayer (first semiconductor sublayer) to an $Al_{0.5}Ga_{0.5}As$ sublayer (second semiconductor sublayer). The vertical axis represents the thermal resistance of the laser device. At a thickness ratio of zero, the spacer layer 330 only includes the $Al_{0.5}Ga_{0.5}As$ sublayers. FIG. 4 shows that the heat dissipation capacity is increased as the proportion of the AlAs sublayers increases.

This effect of improving the thermal resistance decreases at a thickness ratio above one. In the present example, considering the difficulty in continuously growing AlAs, the thickness ratio is set to be one to balance the formation of a long cavity structure and the achievable flatness of the crystal surface. In other words, the first semiconductor sublayers and the second semiconductor sublayers have the same optical thickness.

When the thickness ratio is one, the thermal resistance of the laser device is greatly reduced to about 70% of the thermal resistance of a laser device that includes a long cavity spacer formed only of $Al_{0.5}Ga_{0.5}As$. Because the efficiency of a red surface emitting laser decreases with increasing temperature, this reduction in thermal resistance results in an increase in optical conversion efficiency and an increase in output saturation current due to heat, thus improving the characteristics of the laser device.

As described above, the sublayers 331 and 332 of the spacer layer 330 can have an optical thickness of an integral multiple of $\lambda/2$, and the thickness ratio or the thickness of the sublayers 331 and 332 of the spacer layer 330 may not be an optical thickness of $\lambda/2$. For example, for a crystal grown by MOCVD, because the crystal may be contaminated with carbon, it may be difficult to control the free electron density of n-type AlAs. Thus, the thickness ratio of an AlAs sublayer to an $Al_{0.5}Ga_{0.5}As$ sublayer can be increased in sublayers adjacent to the active layer 350 in which heat dissipation capacity is important, and can be reduced in layers adjacent to the n-type DBR 320. This can reduce the increase in thermal resistance while reducing the effect of free-electron absorption in the AlAs sublayer on the characteristics of the laser device. When a first semiconductor sublayer 331 is closer to the active layer 350 than a second semiconductor sublayer 332, the optical thickness of the first semiconductor sublayer 331 may be $\lambda$, and the optical thickness of the second semiconductor sublayer 332 may be $\lambda/2$. In other words, the optical thickness of the first semiconductor sublayer may be larger than the optical thickness of the second semiconductor sublayer.

While the dry etching is stopped on the AlGaInP layer 340 in the process of manufacturing the post described above, the dry etching may be stopped at the interface between the AlGaInP layer 360 and the upper DBR 370.

A composition-graded sublayer may be placed between the sublayers of the lower DBR 320, the spacer layer 330, and the upper DBR 370 to reduce the electrical resistance. In the composition-graded sublayer, an Al or Ga composition is continuously altered. When a graded sublayer is disposed between the first semiconductor sublayers 331 and the second semiconductor sublayers 332 in the spacer layer 330, the optical thickness of the first and second semiconductor sublayers is defined by the optical thickness between the central part of one graded sublayer and the central part of the opposite graded sublayer. In this case, the first semiconductor sublayers or the second semiconductor sublayers do not have a single composition, but have a plurality of compositions.

The AlAs sublayers 331 may be replaced by $Al_xGa_{1-x}As$ ($x \geq 0.95$) sublayers.

While the spacer layer 330 is disposed between the active layer 350 and the lower DBR 320, the spacer layer 330 may be disposed between the active layer 350 and the upper DBR 370. When the substrate 310 and the lower DBR 320 are of a positive type, and the active layer 350 and other upper layers are of an negative type, the spacer layer 330 can be disposed on the active layer 350, because the n-type layers exhibit lower optical absorption than the p-type layers.

An insulator may be appropriately disposed on the spacer layer 330. Wiring for electric connection with the upper electrode 395 may be disposed on the insulator.

A protective insulating film may be disposed on the highly doped p-type GaAs layer 380.

To reduce the optical absorption, the highly doped p-type GaAs layer 380 may be removed after the manufacture of the laser device, and subsequently a protective insulating film may be disposed on the upper DBR 370.

Second Embodiment

Figure 5:
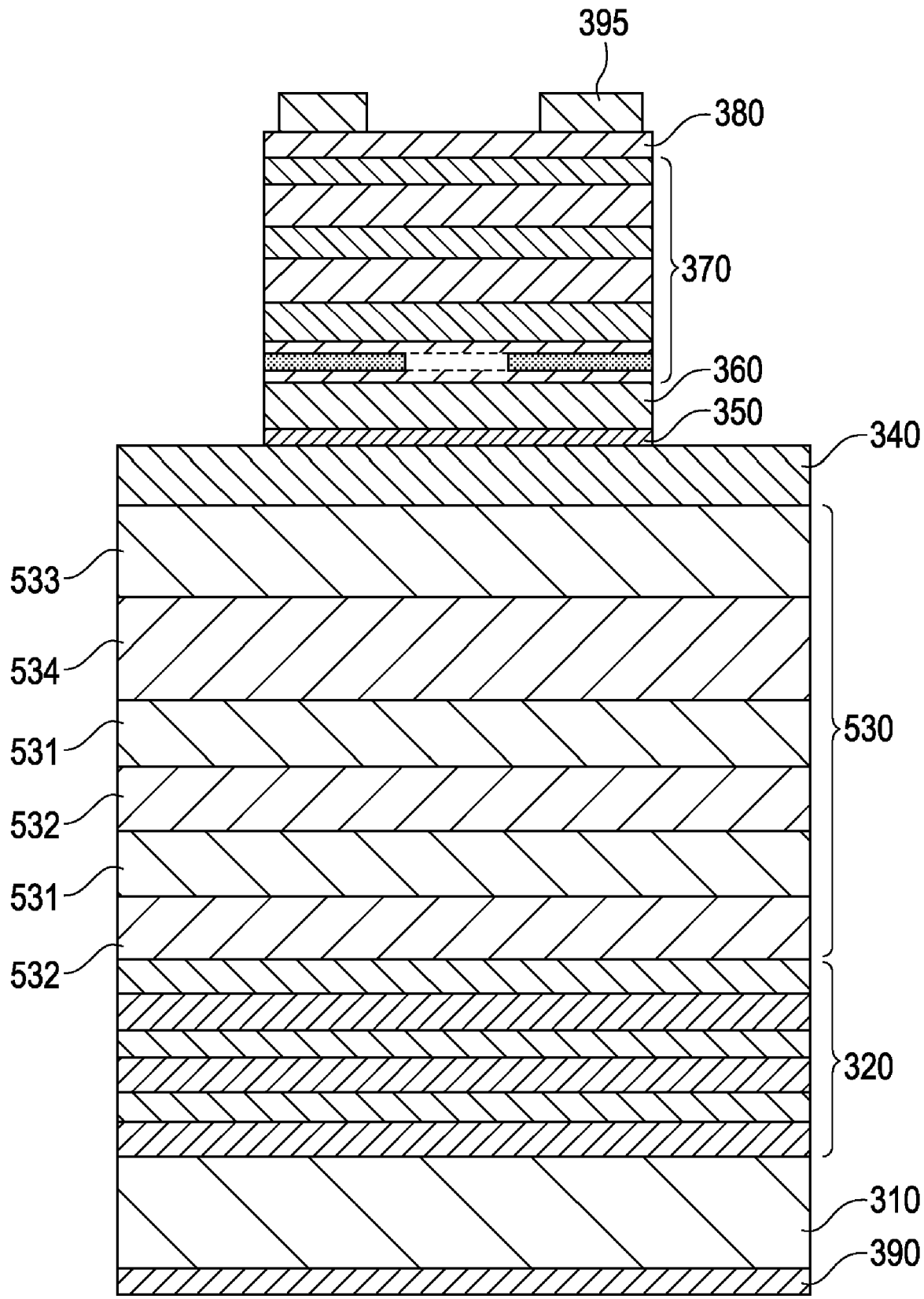
FIG. 5 is a schematic cross-sectional view of a surface emitting laser according to a second embodiment.

FIG. 5 is a schematic cross-sectional view of a surface emitting laser according to a second embodiment. The same reference numerals used in the second embodiment as in the first embodiment denote the same components.

A surface emitting laser according to the second embodiment includes a spacer layer 530 as in the first embodiment. However, the second embodiment is different from the first embodiment in that the sublayers constituting the spacer layer 530 have different thicknesses.

More specifically, an AlAs sublayer 533 having a thickness of 540 nm is disposed directly under the AlGaInP layer 340, and an $Al_{0.5}Ga_{0.5}As$ layer 534 having a thickness of 290 nm is disposed directly under the AlAs sublayer 533. Thus, the AlAs sublayer 533 has an optical thickness of $(5\lambda)/2$, and the $Al_{0.5}Ga_{0.5}As$ sublayer 534 has an optical thickness of $(3\lambda)/2$. The AlAs sublayer 533, having an optical thickness larger than $\lambda/2$, can efficiently dissipate heat from the active layer.

The $Al_{0.5}Ga_{0.5}As$ sublayer 534 serving as a second semiconductor sublayer may be disposed on the AlAs sublayer 533 serving as a first semiconductor sublayer to flatten the surface. This facilitates the crystal growth of subsequent upper layers, such as the active layer 350.

Although the optical thickness of AlAs sublayers 531 and $Al_{0.5}Ga_{0.5}As$ sublayers 532 of the spacer layer 530 is $\lambda/2$, the optical thickness may be an integral multiple of $\lambda/2$.

Third Embodiment

Figure 6:
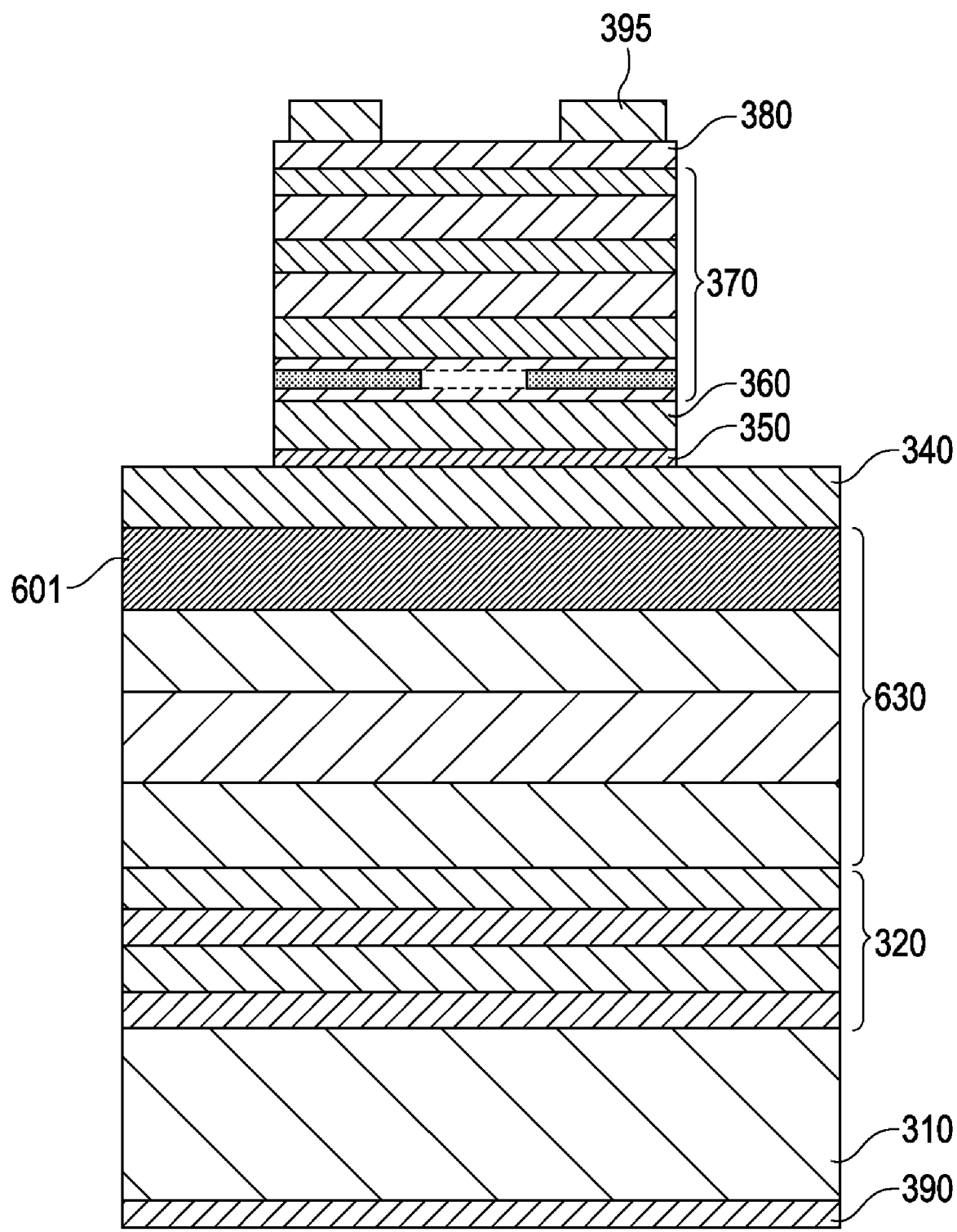
FIG. 6 is a schematic cross-sectional view of a surface emitting laser according to a third embodiment.

FIG. 6 is a schematic cross-sectional view of a surface emitting laser according to a third embodiment. The same reference numerals used in the third embodiment as in the first embodiment denote the same components.

The third embodiment is different from the first embodiment in that an uppermost sublayer of a spacer layer 630 disposed directly under the AlGaInP layer 340 is an $Al_{0.9}Ga_{0.1}As$ sublayer 601. Thus, the first AlAs semiconductor sublayer in the first embodiment is replaced with the $Al_{0.9}Ga_{0.1}As$ sublayer 601.

Such a structure is employed for the following reason: an uppermost AlAs sublayer of the spacer layer exposed in the formation of a mesa structure by dry etching may be oxidized in the process of forming a current confinement structure. Thus, the structure according to the third embodiment can increase the yield of the laser device. In place of $Al_{0.9}Ga_{0.1}As$, AlGaAs having an Al/(Al+Ga) atomic ratio of 0.95 or less or 0.90 or less may be used.

Fourth Embodiment

Figure 7:
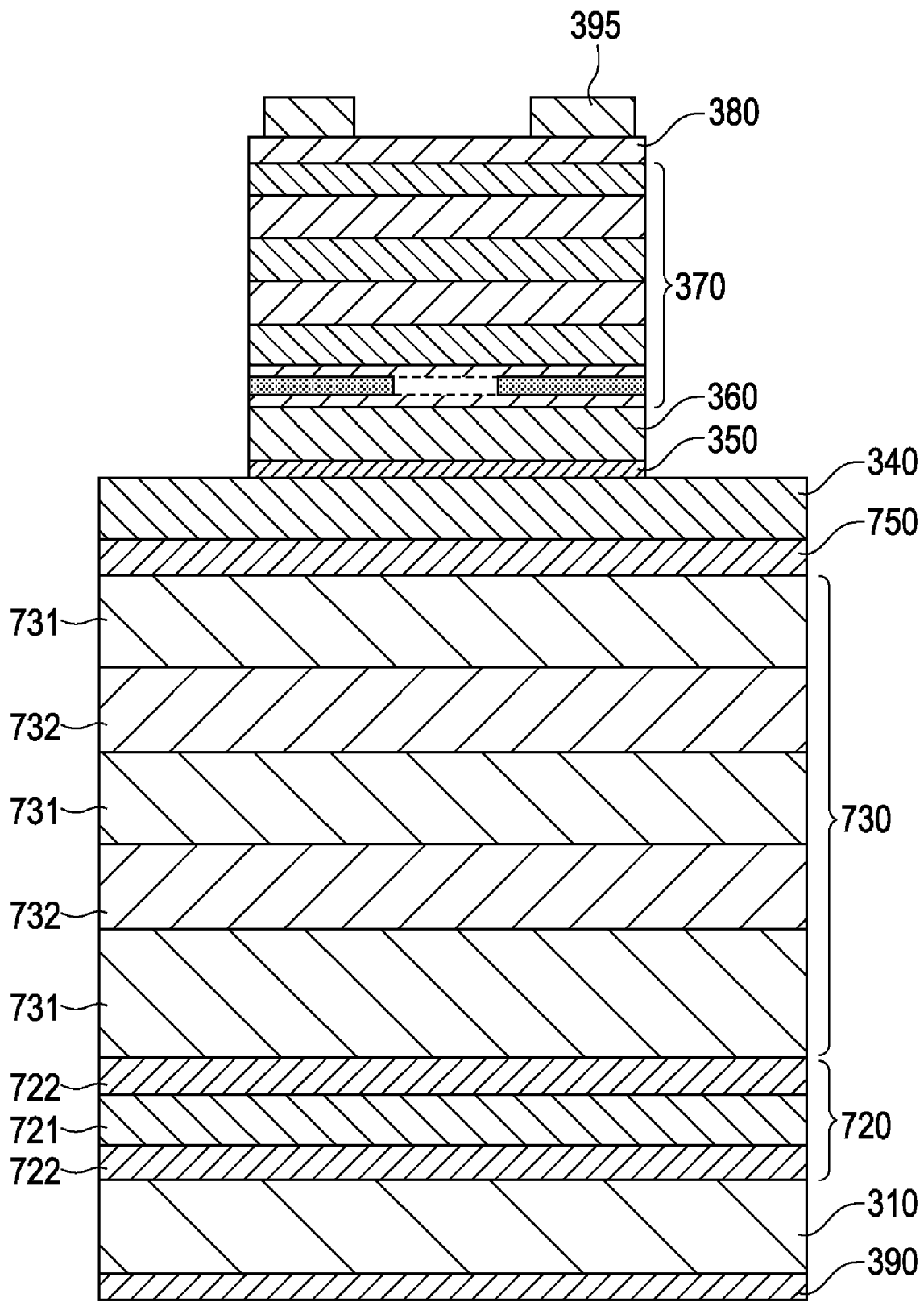
FIG. 7 is a schematic cross-sectional view of a surface emitting laser according to a fourth embodiment.

FIG. 7 is a schematic cross-sectional view of a surface emitting laser according to a fourth embodiment. The same reference numerals used in the fourth embodiment as in the first embodiment denote the same components.

A semiconductor layer 750 having an optical thickness of $\lambda/4$ is disposed directly under the AlGaInP layer 340. An uppermost sublayer of an n-type doped lower DBR 720 is not an AlAs sublayer 721 but instead is an $Al_{0.5}Ga_{0.5}As$ sublayer 722. An uppermost sublayer of a spacer layer 730 is an AlAs sublayer 731. The semiconductor layer 750 is disposed on the spacer layer 730 to make the nodes of the standing wave in the cavity coincide with the interfaces of the sublayers 730 and 731. When a high-concentration dopant or a composition-graded layer is incorporated into the semiconductor interface to decrease the electrical resistance, the semiconductor layer 750 can avoid increasing the optical absorption.

The semiconductor layer 750 controls the position of the standing wave within the cavity and is formed of AlGaAs having an optical thickness of $\lambda/4$. The AlGaAs can have an Al/(Al+Ga) atomic ratio of 0.50 ($Al_{0.5}Ga_{0.5}As$) in terms of achieving a suitable flatness.

Fifth Embodiment

Figure 8:
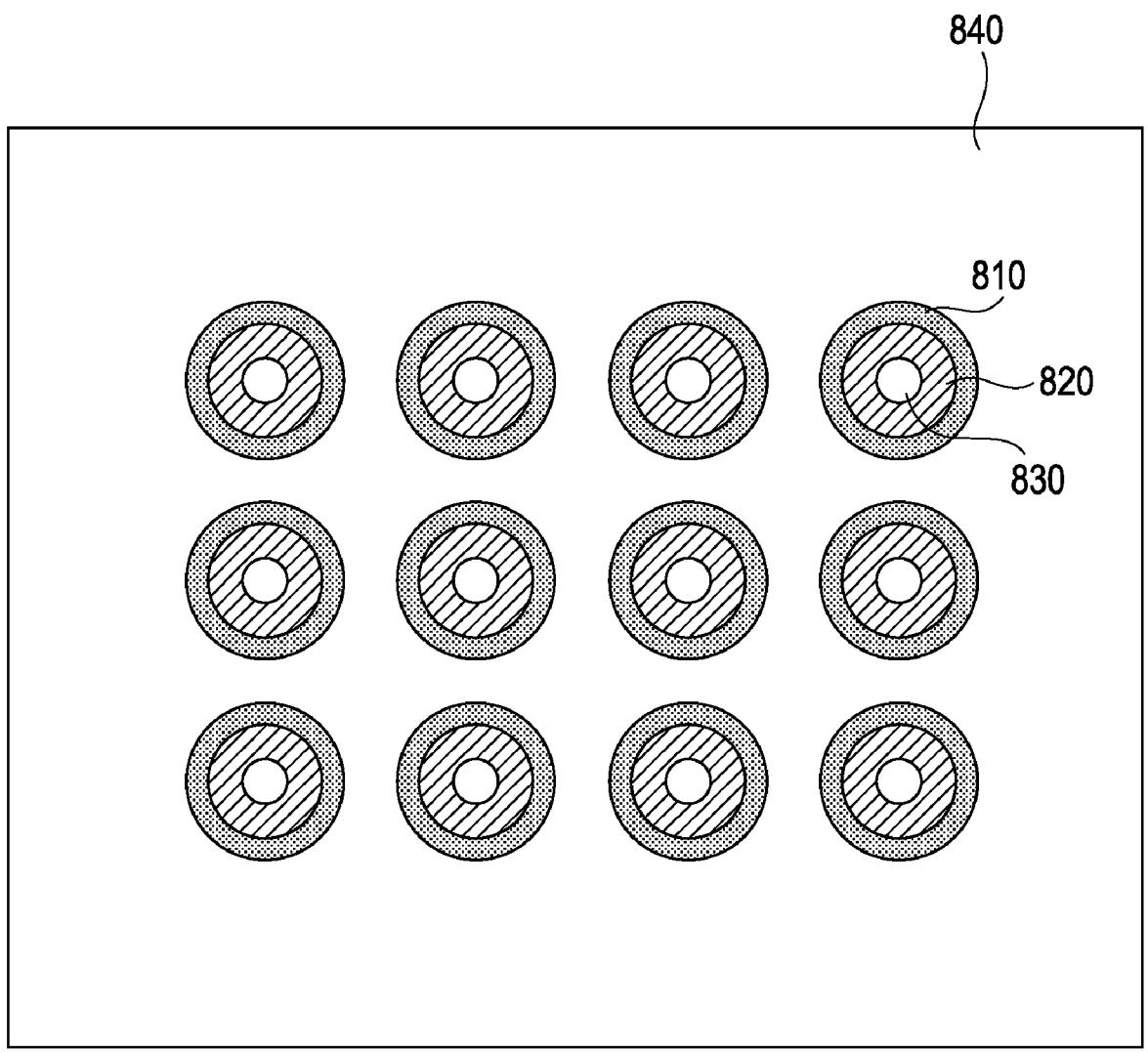
FIG. 8 is a schematic plan view of a surface emitting laser array according to a fifth embodiment.

FIG. 8 is a schematic plan view of a surface emitting laser array according to a fifth embodiment. The present embodiment is an array of 3×4 surface emitting lasers disposed on a substrate. The surface emitting lasers are those described in any of the first to fourth embodiments.

The surface emitting laser array includes posts 810, upper electrodes 820, laser emission regions 830, and a substrate 840.

While the surface emitting lasers are shown to be evenly spaced, the surface emitting lasers may be spaced at irregular intervals. A passivation film, for example, formed of $SiO_2$ may be provided to protect the side and top surfaces of the posts. While the surface emitting lasers are shown to be arranged in a tetragonal lattice pattern, the surface emitting lasers may be arranged in another pattern.

An insulator for electrical insulation and the protection of semiconductor layers, wiring electrically connected to the upper electrodes 820, and a pad electrically connecting the wiring to the outside may be disposed on a portion of the substrate 840 on which no post is formed.

Sixth Embodiment

Figure 9A:
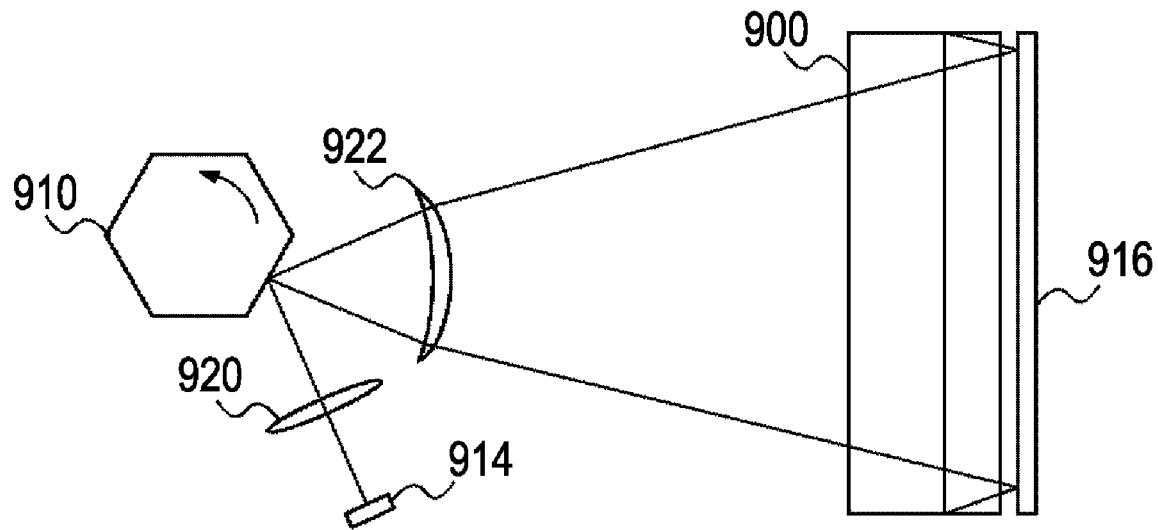
FIG. 9A is a schematic top view of an image forming apparatus according to a sixth embodiment, which includes a surface emitting laser or a surface emitting laser array as an exposure light source.
Figure 9B:
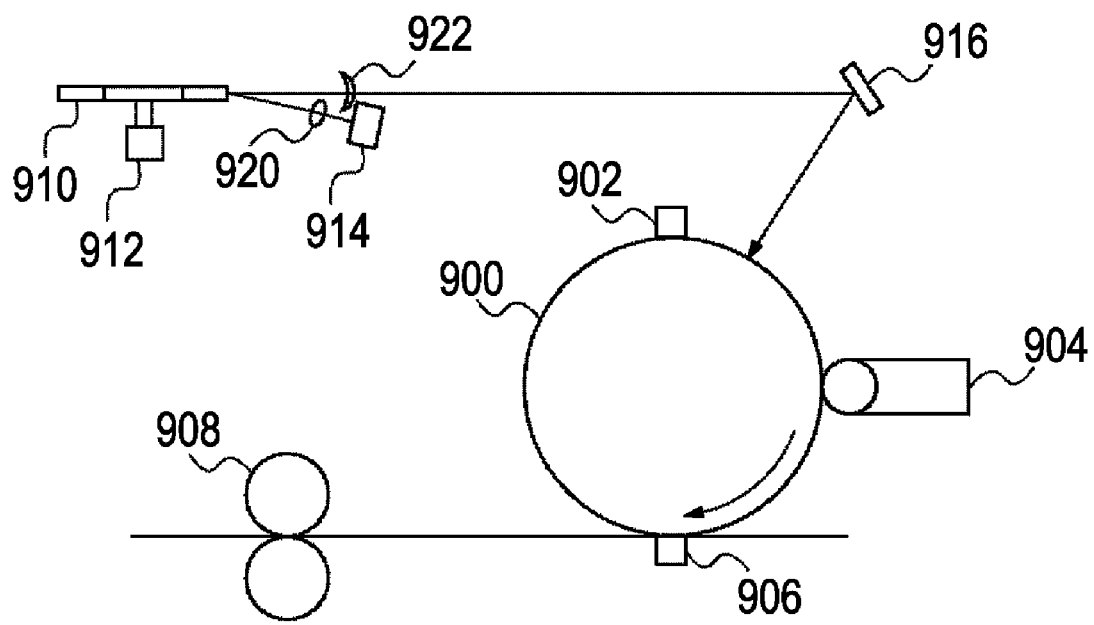
FIG. 9B is a schematic side view of the image forming apparatus.

FIGS. 9A and 9B are schematic views of an electrophotographic recording type image forming apparatus according to a sixth embodiment. The image forming apparatus can include any of the surface emitting lasers or the surface emitting laser array described above.

The image forming apparatus includes a photo conductor, a charging unit configured to electrify the photo conductor, a light-beam irradiation unit configured to irradiate the electrified photo conductor with light to form an electrostatic image, and a developing unit configured to develop the electrostatic image.

FIG. 9A is a top view of the image forming apparatus, and FIG. 9B is a schematic side view of the image forming apparatus. The image forming apparatus includes a photo conductor 900, a charging unit 902, a developing unit 904, a transfer charging unit 906, a fusing unit 908, a rotatable polygonal mirror 910, a motor 912, a surface emitting laser array 914, a reflector 916, a collimating lens 920, and an f-θ lens 922.

The motor 912 drives the rotatable polygonal mirror 910. The rotatable polygonal mirror 910 has six reflective surfaces. The surface emitting laser array 914 emits a laser beam in response to a picture signal by a laser driver (not shown). The laser beam reaches the rotatable polygonal mirror 910 through the collimating lens 920.

The rotatable polygonal minor 910 rotating in the direction of the arrow reflects a laser beam as a deflected beam at an exit angle that alters continuously with the rotation of the rotatable polygonal minor 910. The reflected beam undergoes distortion aberration by the f-θ lens 922 and reaches the photo conductor 900 through the reflector 916. The photo conductor 900 is scanned by the beam in a main scanning direction. A beam reflected from one face of the rotatable polygonal minor 910 forms a plurality of lines of images corresponding to the surface emitting laser array 914 on the photo conductor 900 in the main scanning direction.

The photo conductor 900 is previously charged with electricity by the charging unit 902. When the photo conductor 900 is exposed to the scanning laser beam, an electrostatic latent image is formed. As the photo conductor 900 rotates in the direction of the arrow, the electrostatic latent image is developed by the developing unit 904, and the developed visible image is transferred to a transfer paper (not shown) by the transfer charging unit 906. The transfer paper to which the visible image has been transferred is conveyed to the fusing unit 908 for fixation, and is ejected from the apparatus.

As described above, an electrophotographic recording type image forming apparatus that includes a surface emitting laser or a surface emitting laser array according to embodiments of the present invention can perform high-speed and high-resolution printing.

Although the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Application No. 2007-302979 filed Nov. 22, 2007 and No. 2008-260710 filed Oct. 7, 2008, which are hereby incorporated by reference herein in their entirety.

What is claimed is:

1. A surface emitting laser that oscillates at a wavelength λ, comprising:
   an upper reflector;
   a lower reflector;
   an active layer disposed between the upper reflector and the lower reflector; and
   a spacer layer disposed between the upper reflector or the lower reflector and the active layer,
   wherein the spacer layer has two pairs or more of a laminated structure, each pair including a first semiconductor sublayer having a composition of $Al_xGa_{1-x}As$ ($1 \geq x > 0$) and a second semiconductor sublayer having a composition of $Al_yGa_{1-y}As$ ($1 > y > 0$ and $x > y$).

2. The surface emitting laser according to claim 1, wherein the first semiconductor sublayer has a composition of $Al_xGa_{1-x}As$ ($1 \geq x \geq 0.90$).

3. The surface emitting laser according to claim 1, wherein the first semiconductor sublayer has a composition of AlAs.

4. The surface emitting laser according to claim 1, wherein each of the first semiconductor sublayer and the second semiconductor sublayer has an optical thickness of an integral multiple of λ/2.

5. The surface emitting laser according to claim 1, wherein the first semiconductor sublayer has a same optical thickness as that of the second semiconductor sublayer.

6. The surface emitting laser according to claim 1, wherein the first semiconductor sublayer is disposed closer to the active layer than the second semiconductor sublayer is, and the first semiconductor sublayer has a larger optical thickness than the second semiconductor sublayer.

7. The surface emitting laser according to claim 1, wherein the active layer is formed of GaInP, and the wavelength λ ranges from 630 to 690 nm.

8. The surface emitting laser according to claim 7, wherein the second semiconductor sublayer has a composition of $Al_yGa_{1-y}As$ ($1 > y \geq 0.50$).

9. The surface emitting laser according to claim 7, wherein the second semiconductor sublayer has a composition of $Al_yGa_{1-y}As$ ($0.60 \geq y \geq 0.50$).

10. The surface emitting laser according to claim 1, wherein the spacer layer includes an uppermost AlGaAs sublayer, with an Al/(Al+Ga) atomic ratio being 0.95 or less.

11. The surface emitting laser according to claim 1, wherein a cavity length defined by the upper reflector and the lower reflector is at least 2 μm.

12. The surface emitting laser according to claim 3, wherein the first semiconductor sublayer has a thickness of 1 μm or less.

13. The surface emitting laser according to claim 1, wherein the upper reflector and the lower reflector are multilayer reflectors.

14. A surface emitting laser according to claim 1, wherein the surface emitting laser is included in a plurality of surface emitting lasers as part of a surface emitting laser array, and wherein the plurality of surface emitting lasers are one- or two-dimensionally disposed on a substrate.

15. An image forming apparatus, comprising:
   a photo conductor;
   a charging unit configured to electrify the photo conductor to produce an electrified photo conductor;
   a light-beam irradiation unit configured to irradiate the electrified photo conductor with light to form an electrostatic image; and
   a developing unit configured to develop the electrostatic image,
   wherein the light-beam irradiation unit includes a surface emitting laser as a light source, in which the surface emitting laser includes:
   an upper reflector;
   a lower reflector;
   an active layer disposed between the upper reflector and the lower reflector; and
   a spacer layer disposed between the upper reflector or the lower reflector and the active layer,
   wherein the spacer layer has two pairs or more of a laminated structure, each pair including a first semiconductor sublayer having a composition of $Al_xGa_{1-x}As$ ($1 \geq x > 0$) and a second semiconductor sublayer having a composition of $Al_yGa_{1-y}As$ ($1 > y > 0$ and $x > y$).

16. An image forming apparatus, comprising:
   a photo conductor;
   a charging unit configured to electrify the photo conductor to produce an electrified photo conductor;

a light-beam irradiation unit configured to irradiate the electrified photo conductor with light to form an electrostatic image; and a developing unit configured to develop the electrostatic image, wherein the light-beam irradiation unit includes a surface emitting laser array as a light source, in which the surface emitting laser array includes a plurality of surface emitting lasers, and in which each surface emitting laser includes:

an upper reflector;

a lower reflector;

an active layer disposed between the upper reflector and the lower reflector; and a spacer layer disposed between the upper reflector or the lower reflector and the active layer, wherein the spacer layer has two pairs or more of a laminated structure, each pair including a first semiconductor sublayer having a composition of $Al_xGa_{1-x}As$ ($1 \geq x > 0$) and a second semiconductor sublayer having a composition of $Al_yGa_{1-y}As$ ($1 > y > 0$ and $x > y$).

17. The surface emitting laser according to claim 1, further comprising a graded sublayer provided between the first semiconductor sublayer and the second semiconductor sublayer.

18. The surface emitting laser according to claim 1, wherein the thickness of the spacer layer is 1 μm or more.

19. The surface emitting laser according to claim 1, wherein the thickness of the spacer layer is 2 μm or more.

20. The surface emitting laser according to claim 1, wherein the thermal conductivity of the first semiconductor sublayer is higher than the thermal conductivity of the second semiconductor sublayer.

* * * * *